United States Patent
Lee

(10) Patent No.: US 7,675,233 B2
(45) Date of Patent: *Mar. 9, 2010

(54) ORGANIC LIGHT EMITTING DISPLAY DEVICE AND METHOD OF FABRICATING THE SAME

(75) Inventor: Su-Mi Lee, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 357 days.

This patent is subject to a terminal disclaimer.

(21) Appl. No.: 11/326,181

(22) Filed: Jan. 4, 2006

(65) Prior Publication Data

US 2006/0145606 A1 Jul. 6, 2006

(30) Foreign Application Priority Data

Jan. 5, 2005 (KR) ............... 10-2005-0000992

(51) Int. Cl.
*H01J 1/62* (2006.01)
(52) U.S. Cl. .............. 313/509; 315/169.3; 313/506; 313/512
(58) Field of Classification Search .......... 315/169.3, 315/169.4; 313/498, 504–506, 509, 512; 345/76, 80, 92; 257/758, 734, 291
See application file for complete search history.

(56) References Cited

U.S. PATENT DOCUMENTS

| 5,684,365 | A | * | 11/1997 | Tang et al. ............... 315/169.3 |
| 6,124,604 | A | * | 9/2000 | Koyama et al. ............... 257/72 |
| 6,160,272 | A | * | 12/2000 | Arai et al. ............... 257/291 |
| 6,717,218 | B2 | * | 4/2004 | Hasegawa et al. ............... 257/350 |
| 7,145,290 | B2 | * | 12/2006 | Kang ............... 313/512 |
| 7,196,465 | B2 | * | 3/2007 | Park et al. ............... 313/504 |
| 7,252,570 | B2 | * | 8/2007 | Takashima et al. ............... 313/506 |
| 7,332,745 | B2 | * | 2/2008 | Kang et al. ............... 257/83 |
| 2006/0145605 | A1 | | 7/2006 | Park |

FOREIGN PATENT DOCUMENTS

| KR | 10-2002-0000921 | 1/2002 |
| KR | 2002-0053459 | 7/2002 |
| KR | 2003-0077461 | 10/2003 |
| KR | 10-2003-0084700 | 11/2003 |
| KR | 10-0700650 | 7/2006 |

\* cited by examiner

*Primary Examiner*—Douglas W Owens
*Assistant Examiner*—Ephrem Alemu
(74) *Attorney, Agent, or Firm*—Christie, Parker & Hale, LLP

(57) ABSTRACT

An OLED display device and a method of fabricating the same. The OLED display device has at least one of a common power bus line or a cathode bus line formed at a peripheral portion of the OLED display device. By forming a lower line when a gate electrode of a thin film transistor is formed, and forming an upper line connected to the lower line through a contact hole when source and drain electrodes of the thin film transistor are formed, a dual structure of lower and upper lines is formed. As such, the OLED display device can reduce the width of interconnections without a high voltage drop to thereby increase an emission area of a light emitting portion of the OLED display device.

20 Claims, 6 Drawing Sheets

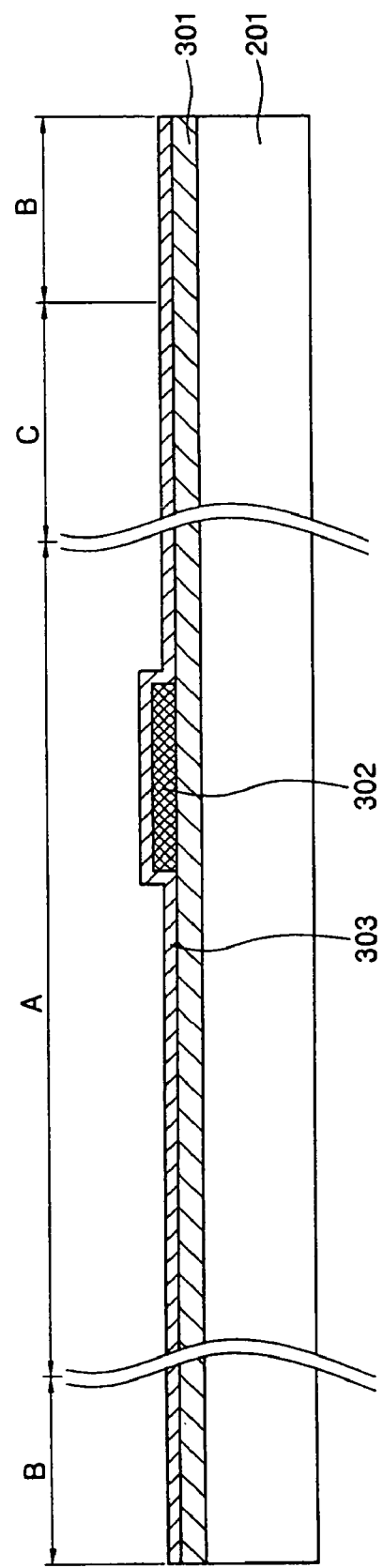

ORGANIC LIGHT EMITTING DISPLAY DEVICE AND METHOD OF FABRICATING THE SAME

CROSS-REFERENCE TO RELATED APPLICATION

This application claims priority to and the benefit of Korean Patent Application No. 10-2005-0000992, filed Jan. 5, 2005, the entire content of which is incorporated herein by reference.

BACKGROUND OF THE INVENTION

1. Field of the Invention

The present invention relates to an organic light emitting diode (OLED) display device and a method of fabricating the same and, more particularly, to an OLED display device and a method of fabricating the same having a dual structure of lower and upper lines connected through a contact hole to form a common power bus line and/or a cathode bus line.

2. Description of the Related Art

Recently, in order to reduce the heavyweight and large volume of a conventional display device such as a cathode ray tube, attentions have been directed to flat panel display devices such as a liquid crystal display device, an OLED display device, a plasma display panel, and so on.

However, since the liquid crystal display device is not a self-emitting device and instead is a light receiving device, it has a limitation in brightness, contrast, viewing angle, large-sized display, and so on. By contrast, the PDP is a self-emitting device, but it is heavier than the other flat panel display devices and has high power consumption, and its manufacturing method is complicated. On the other hand, since the OLED display device is a self-emitting device, it has an excellent viewing angle and contrast, and since it is not necessary to employ a backlight, it is possible to realize a lightweight and compact display device with reduce power consumption.

In addition, the OLED display device can be driven at a low direct current voltage, has a fast response time, and has a high impact resistance because, as a whole, it is made of a solid material. Also, the OLED display device has a broad usage temperature range, and its manufacturing method is simple.

Referring to FIG. 1, a light emitting portion 102 is disposed on a substrate 101. The light emitting portion 102 is composed of unit pixels including a first electrode, an organic layer having at least an organic emission layer, and a second electrode. A scan driver 103 and a data driver 104 are disposed at the peripheral portion of the light emitting portion 102 to transmit electrical signals to the unit pixels. A common power supply bus line 105 and a cathode bus line 106 are also disposed at the peripheral portion of the light emitting portion 102 to supply power. In addition, pads 107 for connecting the common power supply bus line 105 and the cathode bus line 106 with external devices are disposed on the substrate 101 together with the light emitting portion 102.

In FIG. 1, the common power supply bus line 105 and the cathode bus line 106 are made of wide (or broad) metal interconnections in order to supply sufficient power to the unit pixels without a high voltage drop.

However, the broad width of the conventional common power supply bus line and cathode bus line makes it difficult to increase an area of the light emitting portion.

SUMMARY OF THE INVENTION

The present invention, therefore, provides an OLED display device and a method of fabricating the same having a dual structure of lower and upper lines connected through a contact hole to form a common power bus line and/or a cathode bus line.

In an exemplary embodiment of the present invention, an OLED display device includes: a substrate; a light emitting portion formed on the substrate, the light emitting portion including a first electrode, an organic layer having at least an organic emission layer, and a second electrode; and a peripheral portion including a first power line for applying a first voltage level to the light emitting portion and a second power line for applying a second voltage level to the light emitting portion, wherein the first power line includes a first lower line, an insulating layer disposed on the first lower line, and a first upper line electrically contacting the first lower line.

In another exemplary embodiment according to the present invention, a method of fabricating an OLED display device includes: preparing a substrate; forming a semiconductor layer and a gate insulating layer on the substrate; forming and patterning a gate electrode material on the gate insulating layer to form a gate electrode, a scan line, a first lower power line, and a second lower power line; forming an interlayer insulating layer on the substrate; etching the interlayer insulating layer to form contact holes to expose the semiconductor layer, the first lower power line, and the second lower power line; forming and patterning source and drain electrode materials on the substrate to form source and drain electrodes, a first upper power line, and a second upper power line; forming a planarization layer on the substrate; and forming a first electrode, an organic layer including at least an organic emission layer, and a second electrode in a predetermined region of the planarization layer.

BRIEF DESCRIPTION OF THE DRAWINGS

The accompanying drawings, together with the specification, illustrate exemplary embodiments of the present invention, and, together with the description, serve to explain the principles of the present invention.

FIGS. 3A to 3D are cross-sectional views illustrating a method of fabricating an OLED display device in accordance with an exemplary embodiment of the present invention.

DETAILED DESCRIPTION

Figure 1:
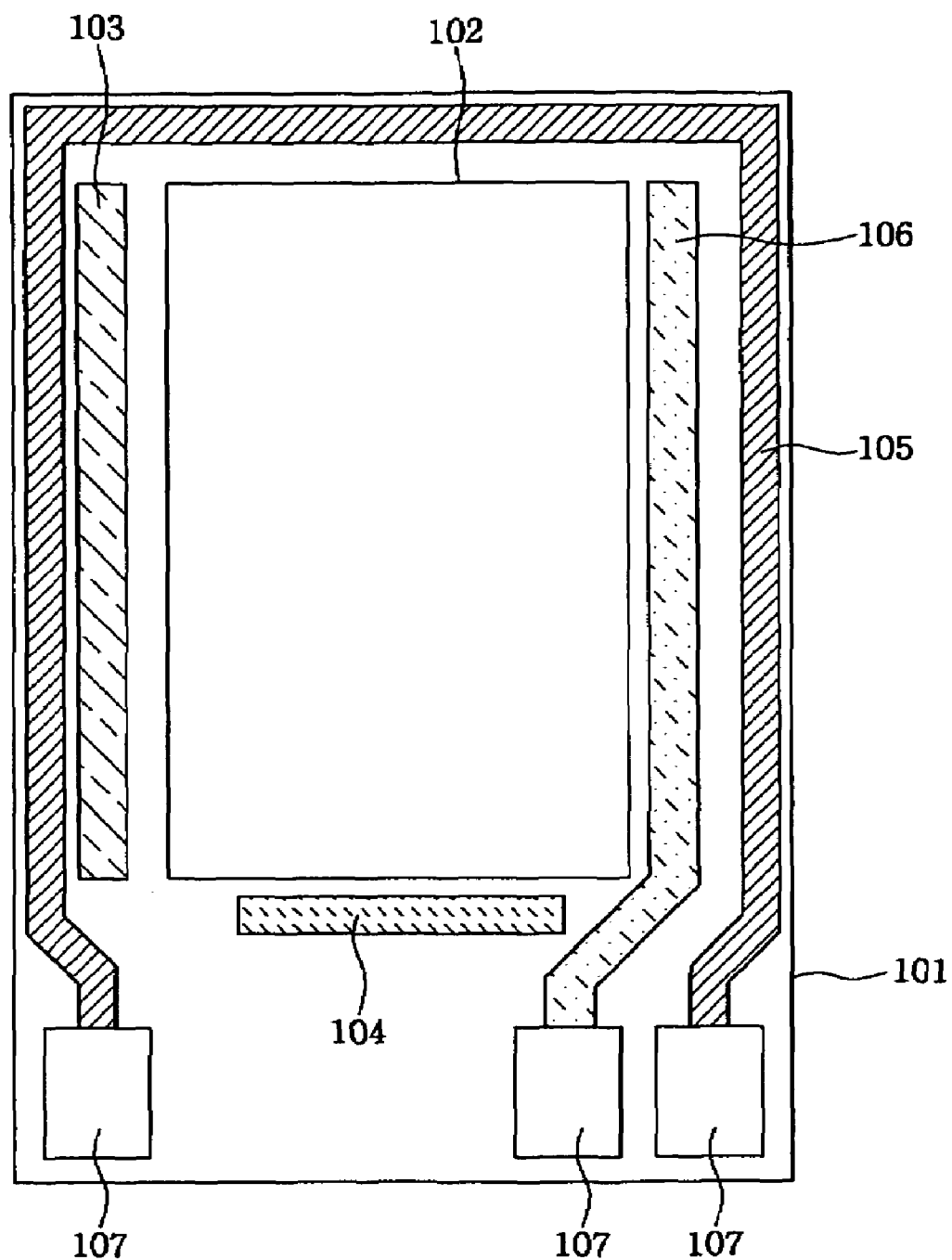
FIG. 1 is a plan view of a conventional OLED display device.

In the following detailed description, certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, rather than restrictive. There may be parts shown in the drawings, or parts not shown in the drawings, that are not discussed in the specification as they are not essential to a complete understanding of the invention. In the drawings, the thickness of layers and regions are exaggerated for clarity. Like reference numerals designate like elements throughout the specification. In addition, when a first element is on a second element, the first element may not only be directly on the second element but may also be indirectly on the second element via a third element.

Figure 2:
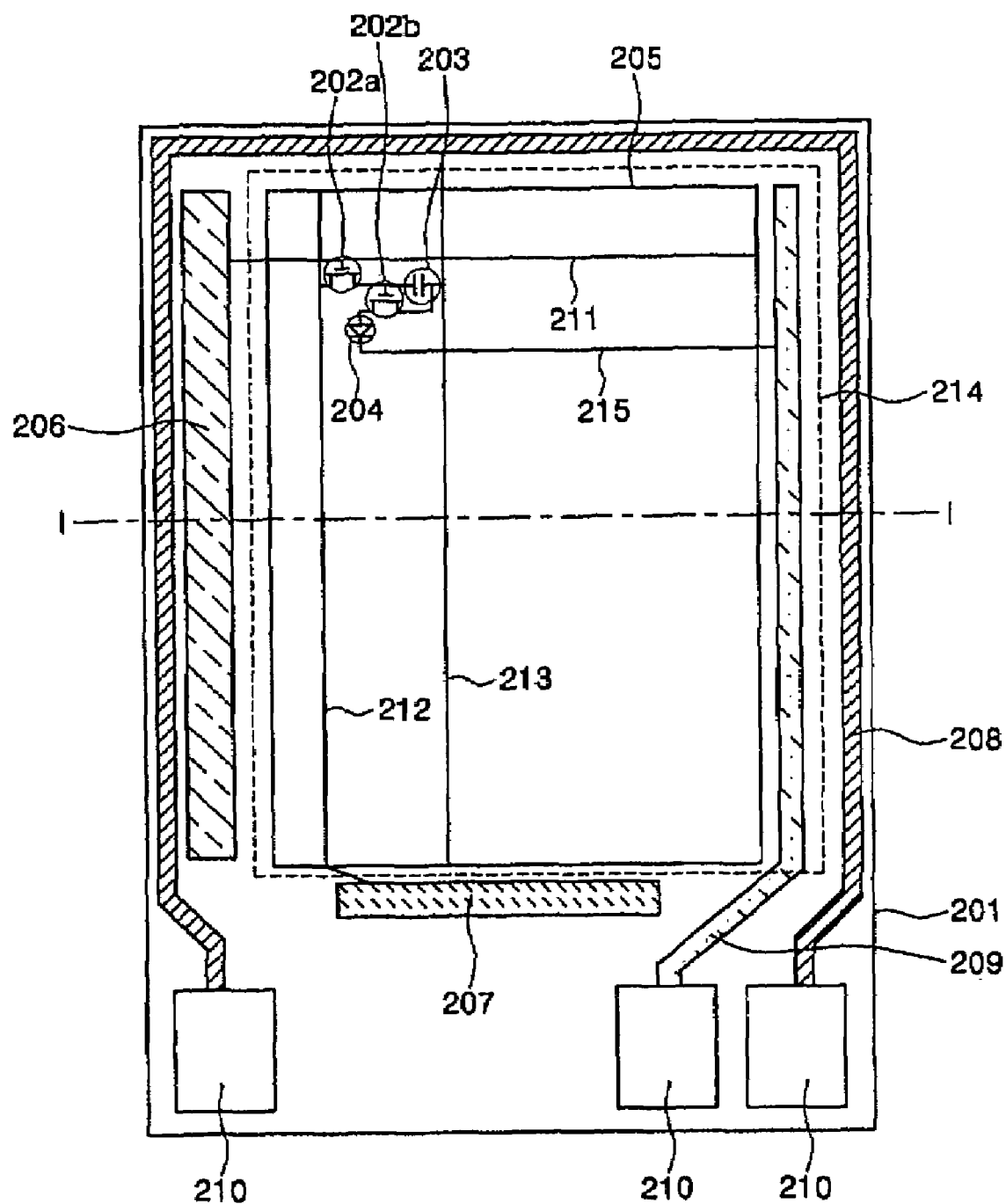
FIG. 2 is a plan view of an OLED display device in accordance with an exemplary embodiment of the present invention.

FIG. 2 is a plan view of an OLED display device in accordance with an exemplary embodiment of the present invention.

Referring to FIG. 2, a light emitting portion 205 is disposed at a center part of a substrate 201 formed from glass, plastic and/or metal. The light emitting portion 205 is composed of a plurality of unit pixels each including a switching thin film transistor and/or a driving thin film transistor (202a and/or 202b) for controlling each of the pixels, a capacitor 203 for storing charges, and an organic light emitting diode 204 having a first electrode, a second electrode 215, and an organic layer having at least an organic emission layer. A scan driver 206 and a data driver 207 for supplying electrical signals or power to the unit pixels in the light emitting portion 205 are disposed at the peripheral portion of the light emitting portion 205. A first power line 208 for applying a first voltage level and a second power line 209 for applying a second voltage level to the light emitting portion 205 are also disposed at the peripheral portion of the light emitting portion 205. Pads 210 are connected to ends of the first and second power lines 208 and 209 to connect the first and second power lines 208 and 209 to external devices.

In FIG. 2, a scan line 211, a data line 212, and a common power line 213 are repeatedly disposed in the light emitting portion 205. The scan line 211 is used to transmit a signal input from the scan driver 206 to each unit pixel, the data line 212 is used to transmit a signal input from the data driver 207 to each unit pixel, and the common power line 213 is used to transmit the first voltage level supplied from the first power line 208 to each unit pixel. In addition, the second power line 209 is in direct contact with the second electrode 214 through a metal line 215 of the organic light emitting diode 204. Further, a sealing substrate may be used to cover the entire light emitting portion 205.

In addition, differing from the conventional art (see FIG. 1), each of the first and second power lines 208 and 209 of the OLED display device in accordance with the embodiment of the present invention has a dual structure of lower and upper lines that are connected through a contact hole to increase an area of the light emitting portion 205 without a high voltage drop. In the embodiment of FIG. 2, the area of the light emitting portion 205 according to the present invention is the sum of the area of a light emitting portion using the conventional single structure and the extra area generated by forming the dual structure of the present invention.

In FIG. 2, while each of the first power line 208 and/or the second power line 209 are shown to be formed by a single line on the face of the OLED display device of FIG. 2, they may each be formed by at least two lines on the face of the OLED display device in order to further prevent the voltage drop.

In addition, while FIG. 2 illustrates that the widths of the first and second power lines 208 and 209 are simultaneously decreased (as compared to FIG. 1), other embodiments of the present invention may only decrease one of the widths of the first and second power lines 208 and 209. In the embodiment of FIG. 2, both of the widths of the first and second power lines 208 and 209 are decreased to increase the area of the light emitting portion 205.

In FIG. 2, the first and second power lines 208 and 209 may be a common power bus line for applying the first voltage level and a cathode bus line for applying the second voltage level to the light emitting portion 205.

FIGS. 3A to 3D are cross-sectional views illustrating a method of fabricating an OLED display device in accordance with an exemplary embodiment of the present invention, taken along line I-I of FIG. 2.

Referring to FIG. 3A, a buffer layer 301 is disposed on the substrate 201 formed from glass, plastic and/or metal. The buffer layer 301 serves to prevent diffusion and/or intrusion of impurities such as ion and/or gas generated from the substrate 201 into devices that are to be formed on the substrate 201. The buffer layer 301 is formed by a least one of a silicon oxide layer, a silicon nitride layer, or a stacked layer using a physical vapor deposition method and/or a chemical vapor deposition method.

After forming the buffer layer 301, an amorphous silicon layer is formed on the substrate 201 to a predetermined thickness using the physical vapor deposition method and/or the chemical vapor deposition method. In addition, a dehydrogenation method for processing gases such as hydrogen contained in the amorphous silicon layer is performed. A crystallization method is then performed to crystallize the amorphous silicon layer into a polysilicon layer and to pattern the polysilicon layer into a semiconductor layer 302.

The crystallization method may use at least one of a rapid thermal annealing (RTA) method, a solid phase crystallization (SPC) method, an excimer laser crystallization (ELC) method, a metal induced crystallization (MIC) method, a metal induced lateral crystallization (MILC) method, or a sequential lateral solidification (SLS) method.

In FIG. 3A, the semiconductor layer 302 is a semiconductor layer of a thin film transistor formed in any one pixel of the plurality of unit pixels formed on the light emitting portion 205, in particular, a semiconductor layer of the thin film transistor being designated by a reference numeral 202b of FIG. 2. Of course, the other thin film transistor 202a may also be simultaneously formed on the substrate 201.

A gate insulating layer 303 formed by at least one of a silicon oxide layer, a silicon nitride layer, or a stacked layer is also formed on the entire surface of the substrate 201.

Figure 3B:
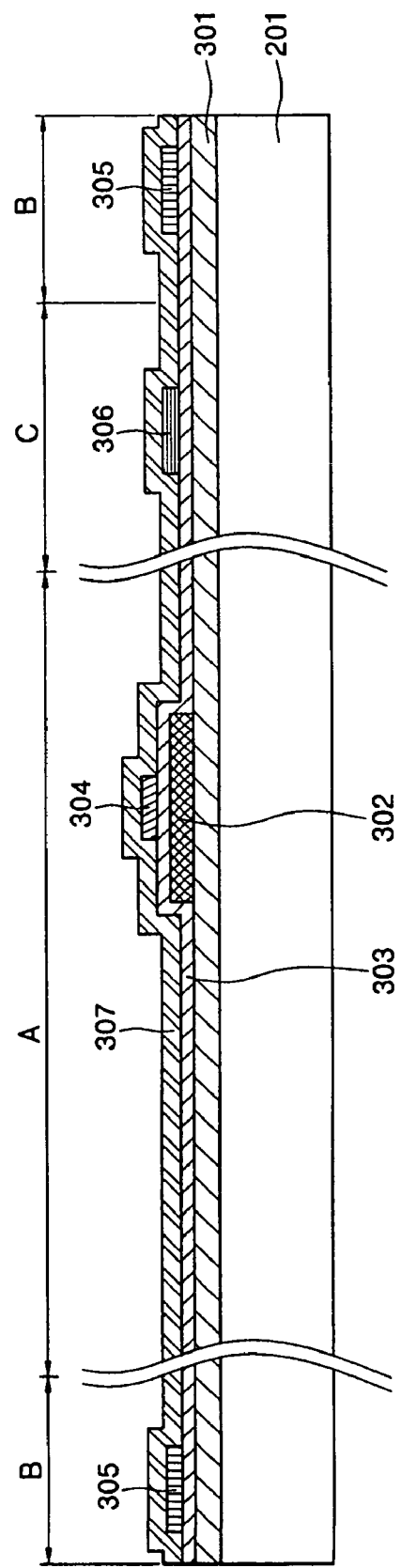

Referring to FIG. 3B, a gate electrode material is deposited on the substrate 201 and patterned to form a gate electrode 304 on a light emitting region A, a first lower line 305 of the first power line 208 on a first power line region B, and a second lower line 306 of the second power line 209 on a second power line region C.

In addition, although not shown, impurities may be injected into the semiconductor layer 302 using the gate electrode 304 as a mask to form source and drain regions.

Also, an interlayer insulating layer 307 formed by at least one of a silicon oxide layer, a silicon nitride layer, or a stacked layer is formed on the entire surface of the substrate 201.

Figure 3C:
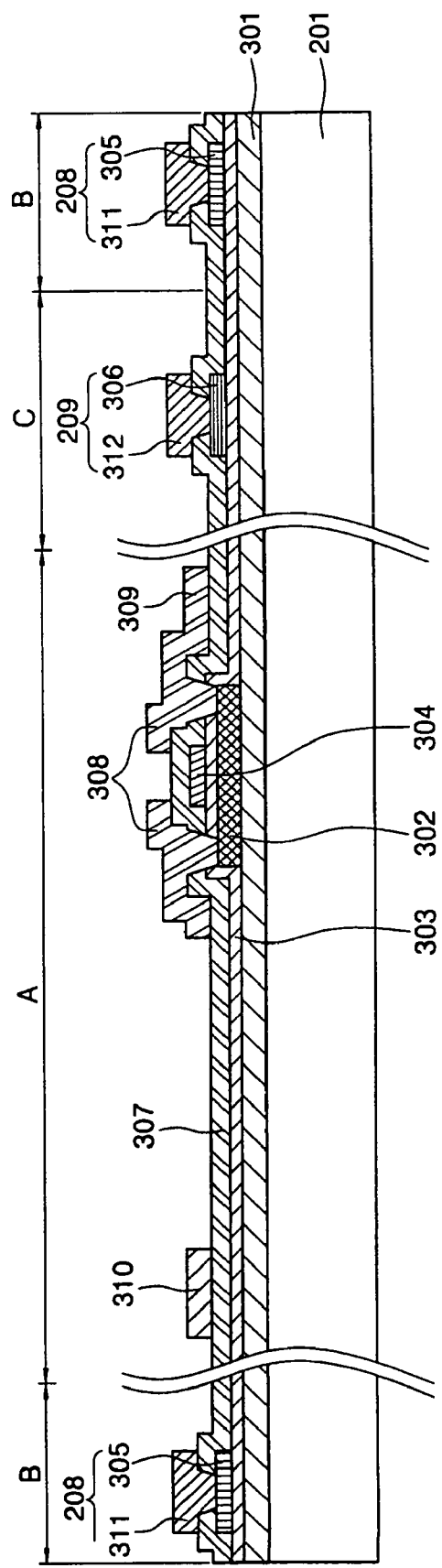

Referring to FIG. 3C, the interlayer insulating layer 307 is patterned using a photoresist pattern to simultaneously form a contact hole for exposing a portion of the semiconductor layer 302, a contact hole for exposing a portion of the first lower line 305, and a contact hole for exposing a portion of the second lower line 306.

In addition, source and drain electrode materials are deposited on the entire surface of the substrate 201 and patterned to form source and drain electrodes 308, a common power line 309, and a data line 310 of the thin film transistor 202b on the light emitting region A, a first upper line 311 of the first power line 208 on the first power line region B, and a second upper line 312 of the second power line 209 on the second power line region C.

In FIG. 3C, the first power line 208 has a dual structure of the first lower and upper lines (or first lower and upper power lines) 305 and 311 formed by patterning the gate electrode material and source and drain electrode materials, respectively, and a contact hole for connecting the first lower and upper lines 305 and 311. The second power line 209 has a dual structure of the second lower and upper lines (or second lower and upper power lines) 306 and 312, and a contact hole for connecting the second lower and upper lines 306 and 312.

In FIG. 3C, the dual structure of the first and second lines 208 and 209 makes the area of the light emitting region A of the light emitting portion 205 larger as compared with a non-dual structure embodiment (see FIGS. 1 and 2). In particular, as the widths of the first and second upper lines 311 and 312 become smaller, the area of the light emitting portion 205 becomes larger.

The contact hole for connecting (or electrically contacting) the first lower and upper lines 305 and 311 of the first power line 208 and the contact hole for connecting (or electrically contacting) the second lower and upper lines 306 and 312 of the second power line 209 may be formed to have various shapes such as a circular shape, a rectangular shape, or a square shape, and at least two contact holes may be formed to connect the first lower and upper lines 305 and 311 of the first power line 208 and to connect the second lower and upper lines 306 and 312 of the second power line 209. That is, the shape and number of the contact holes may be formed with any suitable shapes and/or number.

Figure 3D:
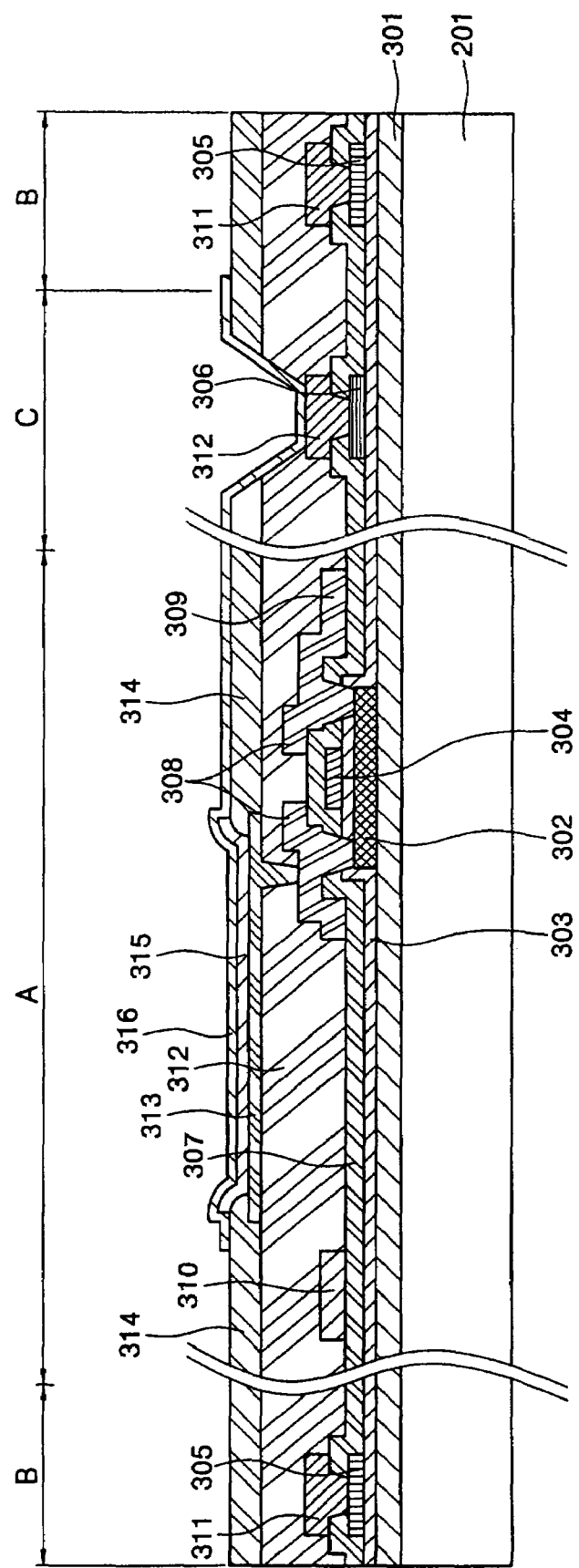

Referring to FIG. 3D, a planarization layer 312 is formed on the entire surface of the substrate 201. Also, before forming the planarization layer 312, a passivation layer (not shown) may be additionally formed.

A portion of the planarization layer 312 of the light emitting region A is then etched to form a via-hole for exposing a portion of the source and drain electrodes 308, and then to form a first electrode 313.

Also, an insulating layer is formed on the entire surface of the substrate 201, and patterned to form a pixel defining layer 314 for exposing a predetermined region of the first electrode 313.

During the etching process for forming the pixel defining layer 314, a process of forming a via-hole for exposing the second upper line 312 of the second power line on the second power line region (or cathode bus line region) C may be simultaneously performed.

In addition, an organic layer 315 including at least an organic emission layer is formed on the first electrode 313.

A second electrode material is then formed on the entire surface of the substrate 201 and patterned to form a second electrode 316 covering at least the organic layer 315 on the light emitting region A and contacting the second upper line 312 of the second power line 209.

As described above, since the first and second power lines 208 and 209 are formed to have a dual structure (or dual line structure) of lower and upper lines, a similar amount of charges can flow in narrower first and second power lines 208 and 209 of the present invention as compared with wider first and second power lines of a conventional single line structure, thereby increasing the area of the light emitting portion 205 without a high voltage drop.

Also, the area of the light emitting portion 205 is increased according to the width of the lower and upper lines of the first and second power lines 208 and 209. For example, when the width of the lower line is large, the width of the upper line can be reduced. Therefore, the light emitting portion can be formed on the extra area resulting from the reduction of the width of the upper line. That is, the area of the light emitting portion 205 is increased in proportion to the increase of the width of the lower line and the reduction of the width of the upper line.

In addition, referring to FIG. 2, the sealing substrate 214 having a moisture absorbent material can be aligned on the substrate 201 for absorbing moistures of the light emitting portion 205. The sealing substrate 214 is hermetically sealed on the substrate 201 to complete the OLED display device.

In view of the foregoing, an OLED display device and a method of fabricating the same of the present invention can increase an emission area of a light emitting portion by forming a common power bus line and/or a cathode bus line to have a dual structure of lower and upper lines connected through a contact hole to thereby reduce a space occupied by interconnections of a peripheral portion.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

What is claimed is:

1. An organic light emitting diode (OLED) display device comprising:
   a substrate;
   a light emitting portion formed on the substrate, the light emitting portion including a first electrode, an organic layer having at least an organic emission layer, and a second electrode; and
   a peripheral portion including a first power line for applying a first voltage level to the light emitting portion and a second power line for applying a second voltage level to the light emitting portion,
   wherein the first power line includes a first lower line, an insulating layer disposed on the first lower line, and a first upper line electrically contacting the first lower line.

2. The OLED display device according to claim 1, wherein the first power line is a common power bus line or a cathode bus line.

3. The OLED display device according to claim 1, wherein the second power line includes a second lower line, the insulating layer disposed on the second lower line, and a second upper line electrically contacting the second lower line.

4. The OLED display device according to claim 3, wherein the second power line is a common power bus line or a cathode bus line.

5. The OLED display device according to claim 1, wherein the light emitting portion further includes at least two thin film transistors and one capacitor.

6. The OLED display device according to claim 5, wherein the at least two thin film transistors comprise a switching thin film transistor and a driving thin film transistor.

7. The OLED display device according to claim 1, wherein the peripheral portion comprises a scan driver and a data driver.

8. The OLED display device according to claim 7, wherein the data driver is connected to source and drain electrodes of a thin film transistor formed on a unit pixel in the light emitting portion.

9. The OLED display device according to claim 7, wherein the scan driver is connected to a gate electrode of a thin film transistor formed on a unit pixel in the light emitting portion.

10. The OLED display device according to claim 1, wherein one of the first and second power lines is connected to a common power line connected to source and drain electrodes of a thin film transistor formed on a unit pixel in the light emitting portion.

11. The OLED display device according to claim 1, wherein one of the first and second power lines is connected to the second electrode of the light emitting portion, the second electrode being electrically connected to the organic layer, the organic layer being formed on a unit pixel in the light emitting portion.

12. The OLED display device according to claim 1, further comprising a plurality of pads, wherein the first and second power lines are connected to the pads at their ends, respectively.

13. The OLED display device according to claim 1, further comprising a sealing substrate hermetically sealed on the substrate to protect the light emitting portion.

14. The OLED display device according to claim 13, wherein the sealing substrate has a moisture absorbent material for absorbing moistures of the light emitting portion.

15. An organic light emitting diode (OLED) display device comprising:
- a substrate;
- an organic light emitting diode formed on the substrate; and
- a peripheral portion including a first power line for applying a first voltage level to the organic light emitting diode and a second power line for applying a second voltage level to the organic light emitting diode,
- wherein the first power line includes a first position level line, an insulating layer disposed on the first position level line, and a second position level line disposed on the insulating layer and electrically contacting the first position level line.

16. The OLED display device according to claim 15, wherein the insulating layer comprises a contact hole and the first position level line electrically contacts the second position level line through the contact hole.

17. The OLED display device according to claim 15, wherein the second power line includes a third position level line, the insulating layer disposed on the third position level line, and a fourth position level line disposed on the insulating layer and electrically contacting the third position level line.

18. The OLED display device according to claim 17, wherein the first position level line and the third position level line have a first planar position level, the second position level line and the fourth position level line have a second planar position level, and the first planar position level is located on the second planar position level with a predetermined space therebetween.

19. A light emitting display device comprising:
- a display region comprising a plurality of pixels, each pixel of the plurality of pixels comprising a transistor, a first electrode, a second electrode, and an OLED comprising an organic light emitting layer, the light emitting layer being between the first electrode and the second electrode; and
- a first power line at a periphery of the display region, the first power line comprising a first lower line, a first upper line, and an interlayer insulating layer at least partially between the first lower line and the first upper line,
- wherein the first electrode is electrically coupled to the transistor through the OLED, and the second electrode is electrically coupled to the first power line.

20. The light emitting display device of claim 19, further comprising a second power line at the periphery of the display region, the second power line comprising a second lower line and a second upper line, wherein the interlayer insulating layer is at least partially between the second lower line and the second upper line, and
wherein the second power line is electrically coupled to each pixel of the plurality of pixels, such that the first power line is adapted to supply a first power supply voltage to the pixels and the second power line is adapted to supply a second power supply voltage to the pixels.

* * * * *